United States Patent
Hosotani

(10) Patent No.: US 6,914,810 B2
(45) Date of Patent: Jul. 5, 2005

(54) MAGNETIC MEMORY DEVICE AND MANUFACTURING METHOD THEREOF

(75) Inventor: Keiji Hosotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/895,841

(22) Filed: Jul. 22, 2004

(65) Prior Publication Data

US 2005/0002230 A1 Jan. 6, 2005

Related U.S. Application Data

(62) Division of application No. 10/316,911, filed on Dec. 12, 2002, now Pat. No. 6,829,162.

(30) Foreign Application Priority Data

Dec. 13, 2001 (JP) .......................................... 2001-380321

(51) Int. Cl.[7] ............................................... G11C 11/15
(52) U.S. Cl. ......................... 365/173; 365/158; 365/171
(58) Field of Search ................................ 365/173, 158, 365/171, 209, 225.5

(56) References Cited

U.S. PATENT DOCUMENTS

| 6,331,944 | B1 | * | 12/2001 | Monsma et al. ............. 365/171 |
| 6,404,673 | B1 | * | 6/2002 | Matsui ........................ 365/173 |
| 6,473,336 | B1 | | 10/2002 | Nakajima et al. |
| 6,538,917 | B1 | | 3/2003 | Tran et al. |
| 6,603,677 | B2 | * | 8/2003 | Redon et al. ................ 365/158 |
| 2001/0031374 | A1 | | 10/2001 | Whang et al. |
| 2002/0000597 | A1 | | 1/2002 | Okazawa |
| 2002/0055016 | A1 | | 5/2002 | Hiramoto et al. |

FOREIGN PATENT DOCUMENTS

| EP | 0 962 939 | 12/1999 |
| EP | 1 085 586 | 3/2001 |
| EP | 1 132 919 | 9/2001 |
| JP | 2001-217398 | 8/2001 |

OTHER PUBLICATIONS

V.N. Samofalov, et al., Journal of Magnetism and Magnetic Materials, vol. 128, No. 3, pp. 354–360, "Features of Remagneization Processes in Stripes of Maltilayer Films With Crossed Easy Axes of Magnetization and Prospects of Their Applications", Dec. 1, 1993.

* cited by examiner

Primary Examiner—Anh Phung
Assistant Examiner—Toan Le
(74) Attorney, Agent, or Firm—Oblon, Spivak, McClelland, Maier & Neustadt, P.C.

(57) ABSTRACT

A magnetic memory device includes magneto resistive elements which are laminated in each cell with easy axes of magnetization set in different directions, each magneto resistive elements having at least two resistance values, and first and second wirings which sandwich the magneto resistive elements and are arranged to extend in different directions from each other.

19 Claims, 14 Drawing Sheets

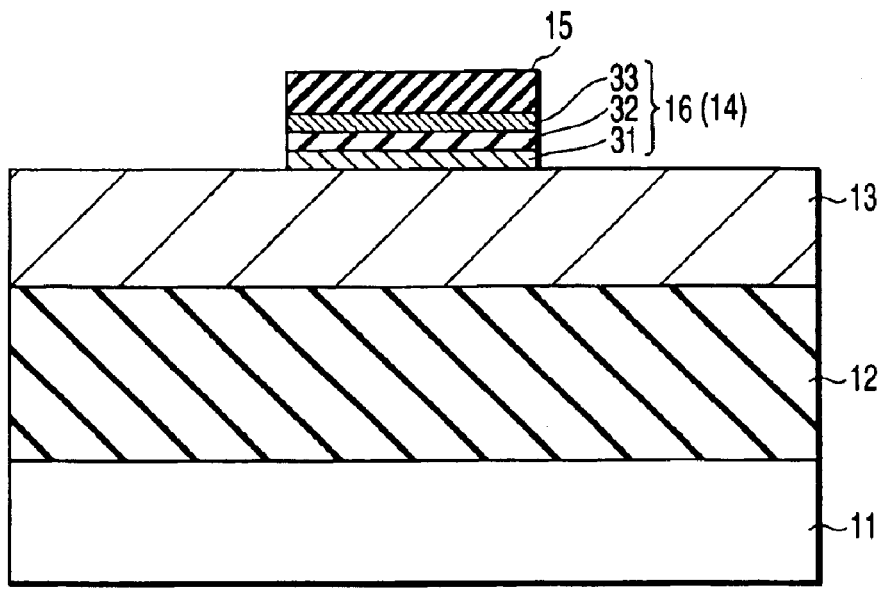
F I G. 6
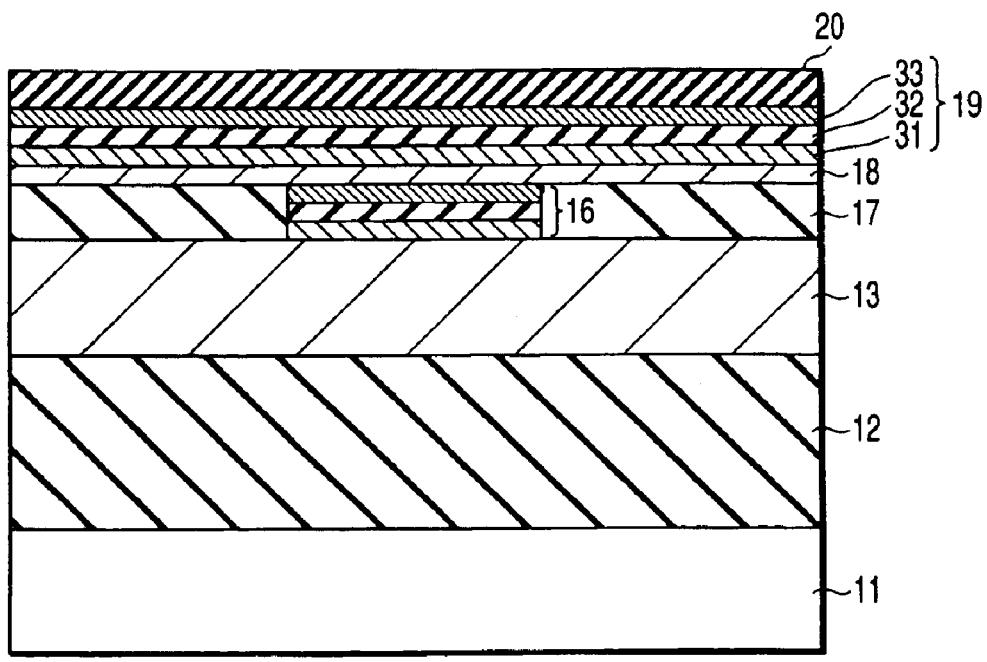
F I G. 7

- - - - Asteroid curve of first TMR element
———— Asteroid curve of second TMR element ▢ First current area when data is written into first TMR element ▢ Second current area when data is written into second TMR element ▢ Third current area when data is written into first and second TMR elements

- - - Asteroid curve of first TMR element
——— Asteroid curve of second TMR element First current area when data is written into first TMR element Second current area when data is written into second TMR element Third current area when data is written into first and second TMR elements

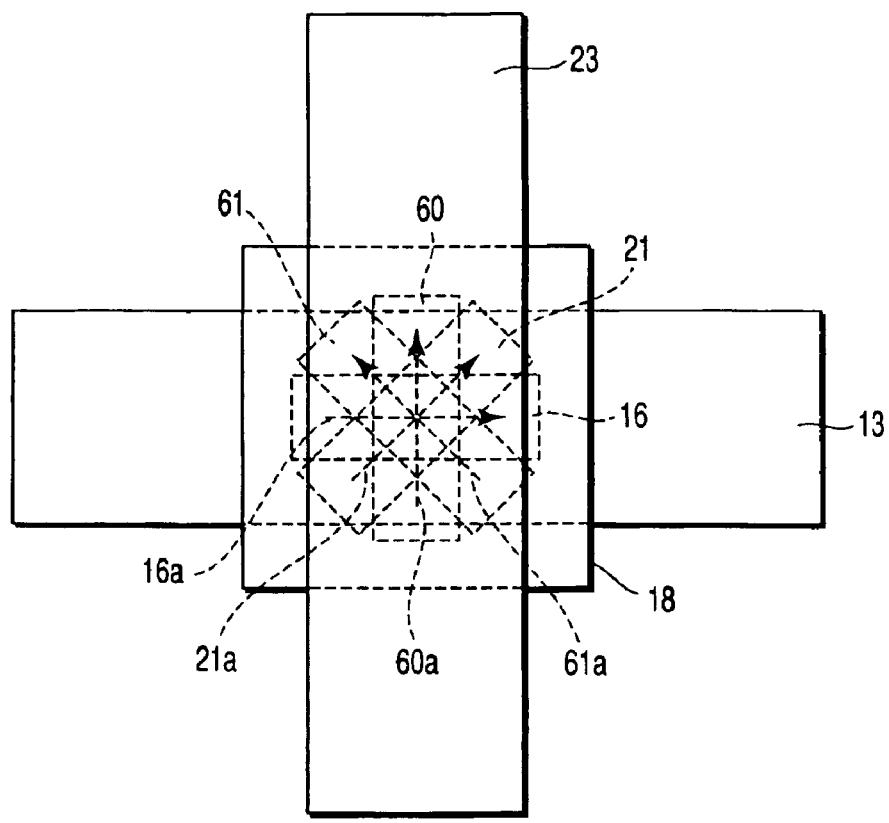
F I G. 20
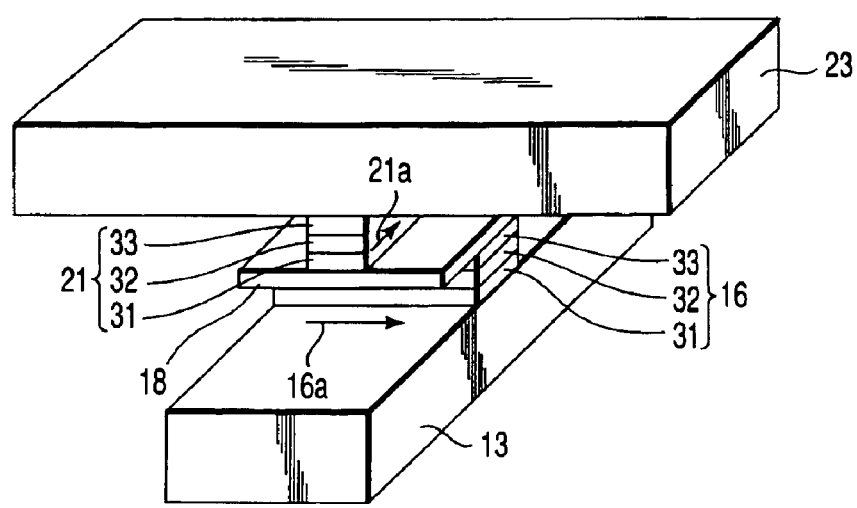
F I G. 21

MAGNETIC MEMORY DEVICE AND MANUFACTURING METHOD THEREOF

CROSS-REFERENCE TO RELATED APPLICATIONS

This application is a division of and claims the benefit of priority under 35 USC §120 from U.S. application Ser. No. 10/316,911, filed Dec. 12, 2002, now U.S. Pat. No. 6,829,162 and is based upon and claims the benefit of priority under 35 USC §119 from Japanese Patent Application No. 2001-380321, filed Dec. 13, 2001, the entire contents of which are incorporated herein by reference.

BACKGROUND OF THE INVENTION

1. Field of the Invention

This invention relates to a magnetic memory device and a manufacturing method thereof, and more particularly, to a magnetic memory device and a manufacturing method thereof for writing data by use of a current magnetic field in each bit, and reading out information of "1", "0" according to the resistance change caused by the change in the cell magnetization state.

2. Description of the Related Art

Recently, an MRAM (Magnetic Random Access Memory) utilizing a tunneling magneto resistive (TMR) effect is proposed as a memory element. MRAMs have been developed to have non-volatility, high-density integration, high reliability and high operation speed thus have great potential in the memory market.

FIG. 26 is a cross sectional view showing part of an MRAM according to the prior art technique. As shown in FIG. 26, first and second wirings 13, 23 are arranged to cross at right angles and an MTJ (Magnetic Tunneling Junction) element 16 is arranged in the cross point portion between the first wiring 13 and the second wiring 23. The MTJ element 16 is connected to the second wiring 23 via an upper electrode (not shown) and connected to a source/drain diffusion layer 52 of a MOS transistor 53 via a lower electrode 55 and contact 54. Further, a gate electrode 51 of the MOS transistor 53 is used as a readout wiring.

The MTJ element 16 is configured by a magnetically fixed layer 31 which is a ferromagnetic layer and connected to the lower electrode 55, a magnetic recording layer 33 which is a ferromagnetic layer and connected to the second wiring 23 via the upper electrode and a tunnel junction layer 32 which is a non-magnetic layer and sandwiched between the magnetically fixed layer 31 and the magnetic recording layer 33.

In the above MRAM, the data write and readout operations are performed as follows.

First, when data is written into a desired selected cell, the state of "1" or "0" data is written into the MTJ element 16 of a selected cell by inverting the magnetization direction of the magnetic recording layer 33. As a result, the resistance of the tunnel junction layer 32 becomes the lowest when the magnetization direction of the magnetic recording layer 33 become the same as the magnetization direction of the magnetically fixed layer 31. In contrast, when the magnetization directions become opposite to each other, the resistance of the tunnel junction layer 32 becomes the highest. A change in the resistance of the tunnel junction layer 32 is read by causing a current to flow in a direction through the MTJ element 16 from the two wirings 23, 13 arranged above and below the MTJ element 16 with the upper electrode and lower electrode 55 which sandwich the MTJ element 16 disposed therebetween. Thus, the storage state of "1", "0" can be determined and information can be read out.

As described above, in the MRAM of the prior art technique, two-value data can be stored for each bit, but it is impossible to store data having a larger value.

BRIEF SUMMARY OF THE INVENTION

A magnetic memory device according to a first aspect of the present invention, comprises magneto resistive elements which are laminated in each cell with the easy axes of magnetization (easy axes) set in different directions, each magneto resistive elements having at least two resistance values, and first and second wirings which sandwich the magneto resistive elements and arranged to extend in different directions.

A magnetic memory device manufacturing method according to a second aspect of the present invention, comprises forming a first wiring which extends in a first direction, laminating magneto resistive elements above the first wiring, the magneto resistive elements respectively having magnetically fixed layers and each having two resistance values, forming a second wiring which extends in a second direction different from the first direction on the magneto resistive elements, and sequentially performing heat treatments in a magnetic field at different temperatures with respect to the magneto resistive elements and fixing magnetization directions of the magnetically fixed layers of the magneto resistive elements in different directions.

BRIEF DESCRIPTION OF THE SEVERAL VIEWS OF THE DRAWING

FIGS. 6, 7, 8, 9, 10 are cross sectional views respectively showing manufacturing steps of the magnetic memory device according to the first embodiment of the present invention, FIG. 20 is a plan view showing a magnetic memory device according to a fifth embodiment of the present invention, FIG. 21 is a perspective view showing a magnetic memory device having no switching element according to a sixth embodiment of the present invention.

DETAILED DESCRIPTION OF THE INVENTION

A magnetic memory device (MRAM: Magnetic Random Access Memory) according to each embodiment of the present invention includes a plurality of MTJ (Magnetic Tunneling Junction) elements utilizing the tunneling magneto resistive (TMR) effect in each cell and can hold data of four values or more for each bit.

There will now be described embodiments of this invention with reference to the accompanying drawings. In the following explanation, common reference symbols are attached to common portions throughout the drawings.

[First Embodiment]

The first embodiment is an example in which two MTJ elements are laminated in each cell without overlapping the directions of easy axes thereof (without setting the easy axes in the same direction).

Figure 1:
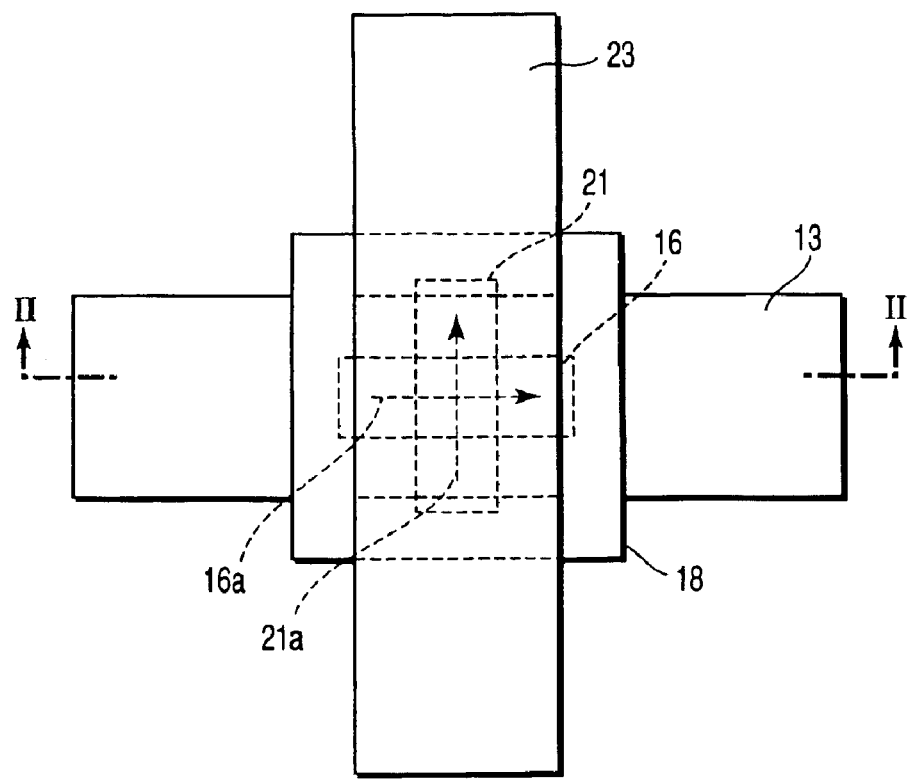
FIG. 1 is a plan view showing a magnetic memory device according to a first embodiment of the present invention.
Figure 2:
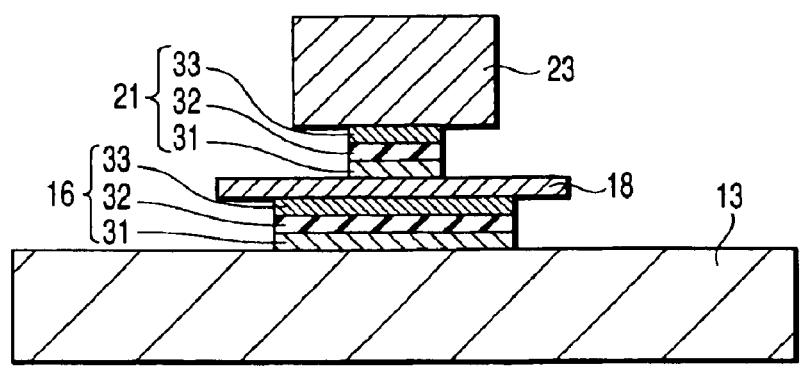
FIG. 2 is a cross sectional view showing the magnetic memory device taken along the II-II line of FIG. 1.
Figure 3:
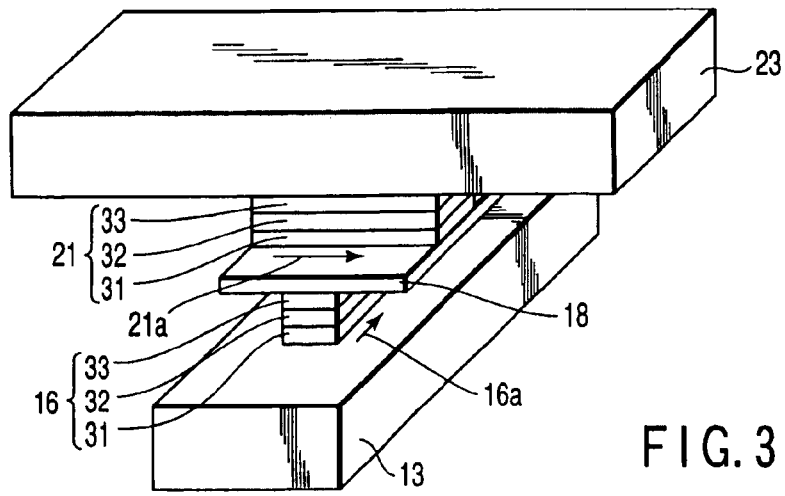
FIG. 3 is a perspective view showing the magnetic memory device according to the first embodiment of the present invention.

FIG. 1 is a plan view showing a magnetic memory device according to the first embodiment of the present invention. FIG. 2 is a cross sectional view showing the magnetic memory device taken along the II—II line of FIG. 1. FIG. 3 is a perspective view showing the magnetic memory device according to the first embodiment of the present invention. The configuration of the magnetic memory device according to the first embodiment of the present invention is explained below.

As shown in FIGS. 1 to 3, the magnetic memory device according to the first embodiment includes first and second wirings 13, 23 which extend in difference directions, and first and second MTJ elements 16, 21 sandwiched between the first and second wirings 13 and 23. The first and second MTJ elements 16, 21 are arranged with axes 16a, 21a of easy magnetization set in different directions. In this case, it is possible to form an etching stopper layer (non-magnetic layer) which is used as a stopper at the time of patterning of the MTJ elements 16, 21 between the first and second MTJ elements 16 and 21.

In the first embodiment, the first and second wirings 13, 23 are arranged to cross at right angles and a configuration which is suitable for configuring a large-scale cell array is provided. Further, the axis 16a of easy magnetization of the first MTJ element 16 is set in the same direction as the extending direction of the first wiring 13 and the axis 21a of easy magnetization of the second MTJ element 21 is set in the same direction as the extending direction of the second wiring 23. Therefore, the axis 16a of easy magnetization of the first MTJ element 16 and the axis 21a of easy magnetization of the second MTJ element 21 cross at right angles.

As described above, the MTJ elements 16, 21 arranged and laminated with the directions of the axes 16a, 21a of easy magnetization being not overlapped are each configured by three layers including a magnetically fixed layer (magnetic layer) 31 whose magnetization direction is fixed, a tunnel junction layer (non-magnetic layer) 32 and a magnetic recording layer (magnetic layer) 33 whose magnetization direction is inverted. The positions of the magnetically fixed layer 31 and the magnetic recording layer 33 can be exchanged and the MTJ elements 16, 21 may be formed with a single tunnel junction structure which is configured by a single-layered tunnel junction layer 32 or a double tunnel junction structure which is configured by a double-layered tunnel junction layer 32. Examples of the MTJ elements 16, 21 with the single tunnel junction structure or double tunnel junction structure are explained below.

Figure 4A:
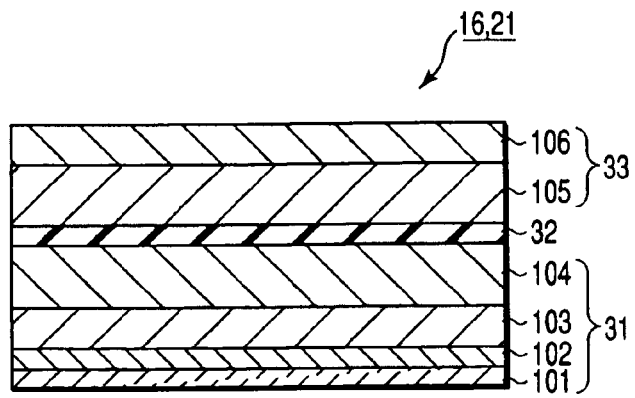
FIGS. 4A, 4B are cross sectional views showing MTJ elements with a single tunnel junction structure according to respective embodiments of the present invention.

The MTJ elements 16, 21 with the single tunnel junction structure shown in FIG. 4A each include a magnetically fixed layer 31 having a template layer 101, initial ferromagnetic layer 102, anti-ferromagnetic layer 103 and reference ferromagnetic layer 104 which are sequentially laminated, a tunnel junction layer 32 formed on the magnetically fixed layer 31 and a magnetic recording layer 33 having a free ferromagnetic layer 105 and contact layer 106 which are sequentially laminated on the tunnel junction layer 32.

Figure 4B:
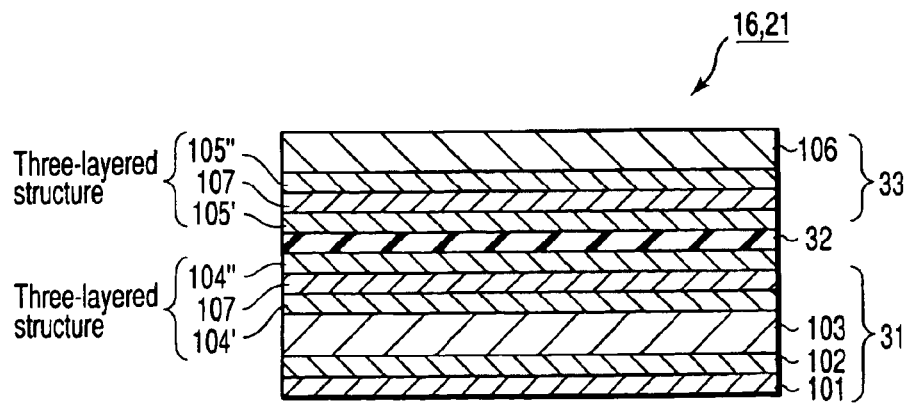

The MTJ elements 16, 21 with the single tunnel junction structure shown in FIG. 4B each include a magnetically fixed layer 31 having a template layer 101, initial ferromagnetic layer 102, anti-ferromagnetic layer 103, ferromagnetic layer 104', non-magnetic layer 107 and ferromagnetic layer 104" which are sequentially laminated, a tunnel junction layer 32 formed on the magnetically fixed layer 31 and a magnetic recording layer 33 having a ferromagnetic layer 105', non-magnetic layer 107, ferromagnetic layer 105" and contact layer 106 which are sequentially laminated on the tunnel junction layer 32.

In the MTJ elements 16, 21 shown in FIG. 4B, occurrence of magnetic poles in the ferromagnetic internal portion can be suppressed and a cell structure which is more suitable for miniaturization can be proposed in comparison with the MTJ elements 16, 21 shown in FIG. 4A by using the three-layered structure including the ferromagnetic layer 104', non-magnetic layer 107 and ferromagnetic layer 104" in the magnetically fixed layer 31 and the three-layered structure including the ferromagnetic layer 105', non-magnetic layer 107 and ferromagnetic layer 105" in the magnetic recording layer 33.

Figure 5A:
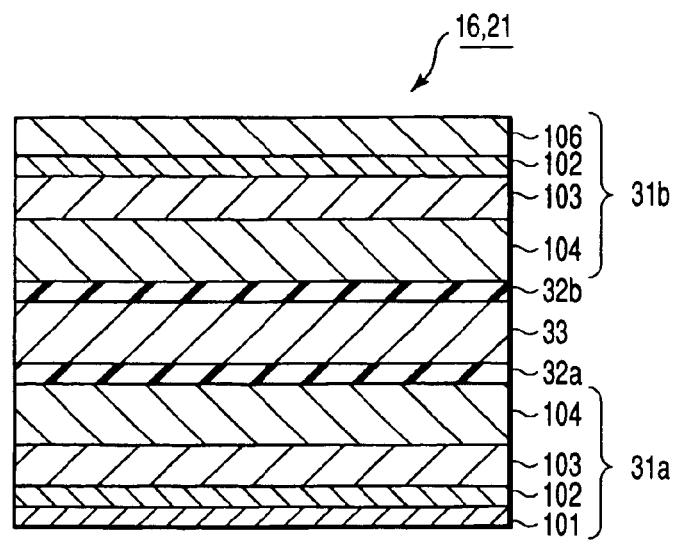
FIGS. 5A, 5B are cross sectional views showing MTJ elements with a double tunnel junction structure according to respective embodiments of the present invention.

The MTJ elements 16, 21 with the double tunnel junction structure shown in FIG. 5A each include a first magnetically fixed layer 31a having a template layer 101, initial ferromagnetic layer 102, anti-ferromagnetic layer 103 and reference ferromagnetic layer 104 which are sequentially laminated, a first tunnel junction layer 32a formed on the first magnetically fixed layer 31a, a magnetic recording layer 33 formed on the first tunnel junction layer 32a, a second tunnel junction layer 32b formed on the magnetic recording layer 33, and a second magnetically fixed layer 31b having a reference ferromagnetic layer 104, anti-ferromagnetic layer 103, initial ferromagnetic layer 102 and contact layer 106 which are sequentially laminated on the second tunnel junction layer 32b.

Figure 5B:
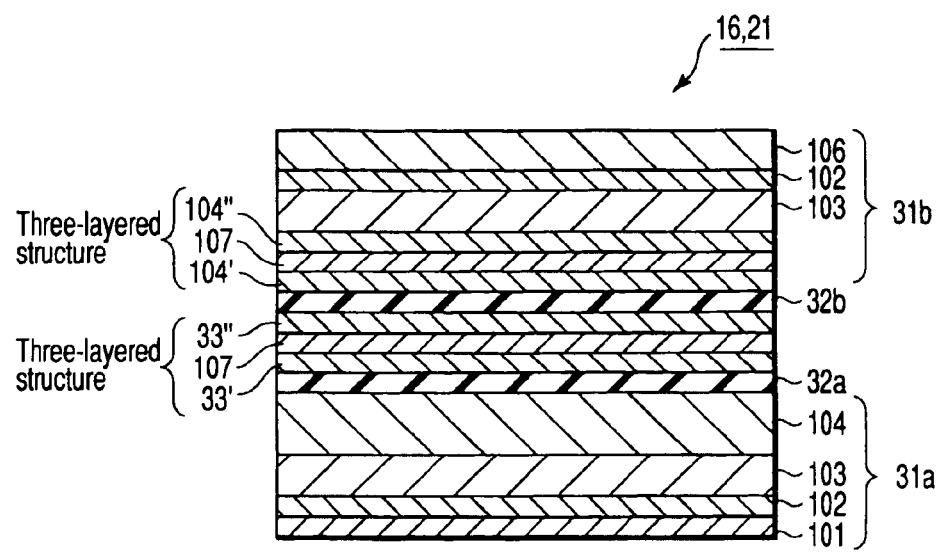

The MTJ elements 16, 21 with the double tunnel junction structure shown in FIG. 5B each include a first magnetically fixed layer 31a having a template layer 101, initial ferromagnetic layer 102, anti-ferromagnetic layer 103 and reference ferromagnetic layer 104 which are sequentially laminated, a first tunnel junction layer 32a formed on the first magnetically fixed layer 31a, a magnetic recording layer 33 having a three-layered structure which includes a ferromagnetic layer 33', non-magnetic layer 107 and ferromagnetic layer 33" which are sequentially laminated on the first tunnel junction layer 32a, a second tunnel junction layer 32b formed on the magnetic recording layer 33, and a second magnetically fixed layer 31b having a ferromagnetic layer 104', non-magnetic layer 107, ferromagnetic layer 104", anti-ferromagnetic layer 103, initial ferromagnetic layer 102 and contact layer 106 which are sequentially laminated on the second tunnel junction layer 32b.

In the MTJ elements 16, 21 shown in FIG. 5B, occurrence of magnetic poles in the ferromagnetic internal portion can be suppressed and a cell structure which is more suitable for miniaturization can be proposed in comparison with the MTJ elements 16, 21 shown in FIG. 5A by using the three-layered structure including the ferromagnetic layer 33', non-magnetic layer 107 and ferromagnetic layer 33" which configure the magnetic recording layer 33 and the three-layered structure including the ferromagnetic layer 104', non-magnetic layer 107 and ferromagnetic layer 104" in the second magnetically fixed layer 31b.

In the MTJ elements 16, 21 with the double tunnel junction structure, deterioration in the MR (Magneto Resistive) ratio (the variation ratio in resistance in the "1" state and "0" state) is less when the same external bias is applied thereto, and as a result, they can be operated on higher bias voltage in comparison with the MTJ elements 16, 21 with the single tunnel junction structure. That is, the double tunnel junction structure is advantageous in reading out information of a cell.

The MTJ elements 16, 21 with the single tunnel junction structure or double tunnel junction structure are formed by using the following materials, for example.

For example, as the materials of the magnetically fixed layers 31, 31a, 31b and magnetic recording layer 33, it is preferable to use Fe, Co, Ni, an alloy thereof, magnetite having high spin polarizability, oxide such as $CrO_2$, $RXMnO_{3-y}$ (R: rare earth element, X: Ca, Ba, Sr), or a Heusler alloy such as NiMnSb, PtMnSb. Further, in the above magnetic material, a small amount of a non-magnetic element or elements such as Ag, Cu, Au, Al, Mg, Si, Bi, Ta, B, C, O, N, Pd, Pt, Zr, Ir, W, Mo, Nb may be contained as long as the ferromagnetism can be maintained.

As the material of the anti-ferromagnetic layer 103 which configures part of the magnetically fixed layers 31, 31a, 31b, it is preferable to use Fe—Mn, Pt—Mn, Pt—Cr—Mn, Ni—Mn, Ir—Mn, NiO, $Fe_2O_3$ or the like.

As the material of the tunnel junction layers 32, 32a, 32b, it is possible to use various dielectric substances, such as $Al_2O_3$, $SiO_2$, MgO, AlN, $Bi_2O_3$, $MgF_2$, $CaF_2$, $SrTiO_2$, $AlLaO_3$ or the like. It is permissible even if oxygen, nitrogen or fluorine defects exist in the above dielectric substances.

As described above, the MTJ elements 16, 21 may be configured with the single tunnel junction structure or double tunnel junction structure and any material can be used if it belongs to the above materials. However, in order to realize an MRAM which holds four-value data for each bit, it is necessary to set resistance change amounts ΔR1, ΔR2 in the "1", "0" states of the first and second MTJ elements 16, 21 to different values.

Therefore, the following MTJ elements 16, 21 can be formed to set the resistance change amounts ΔR1, ΔR2 to different values. For example, the film thickness of the tunnel junction layer 32 of the first MTJ element 16 may be made different from that of the tunnel junction layer 32 of the second MTJ element 21. Further, the first and second MTJ elements 16, 21 may be formed with different sizes.

In addition, the MR ratios may be set to different values by forming the first and second MTJ elements 16, 21 by use of different materials. For example, when Co9-Fe is used as the magnetically fixed layer 31 (in this case, the anti-ferromagnetic layer is formed of Pt—Mn, for example), the MR ratios can be set to different values by use of the following material for the magnetic recording layer 33. That is, when the material for the magnetic recording layer 33 is Co—Fe, the MR ratio becomes 50% or less, when it is Co—Fe—Ni, the MR ratio becomes 40% to 50%, and when it is Ni—Fe, the MR ratio becomes 35% or less.

One of the first and second MTJ elements 16, 21 may be formed with the single tunnel junction structure and the other MTJ element may be formed with the double tunnel junction structure. With this structure, the MR ratios and resistances of the first and second MTJ elements 16, 21 can be respectively set to different values.

FIGS. 6 to 10 are cross sectional views respectively showing manufacturing steps of the magnetic memory device according to the first embodiment of the present invention. The manufacturing method of the magnetic memory device according to the first embodiment is explained below.

First, as shown in FIG. 6, a first wiring 13 is formed on a semiconductor substrate 11 with an insulating film 12 or the like disposed therebetween and a first TMR material layer 14 is formed on the first wiring 13. In the case of the single tunnel junction structure, for example, the first TMR material layer 14 is formed of three layers including a magnetically fixed layer 31, tunnel junction layer 32 and magnetic recording layer 33. Then, a hard mask 15 which is formed of a DLC (Diamond Like Carbon) film, for example, is formed on the first TMR material layer 14 and patterned. After this, the first TMR material layer 14 is selectively removed by performing an RIE (Reactive Ion Etching) process or ion milling process by use of the patterned hard mask 15 so as to form a first MTJ element 16. Then, the patterned hard mask 15 is removed.

Next, as shown in FIG. 7, an insulating film 17 is formed on the first MTJ element 16 and first wiring 13 and a surrounding space portion of the first MTJ element 16 is filled with the insulating film 17. Then, the insulating film 17 is polished or made flat until the surface of the first MTJ element 16 is exposed. After this, an etching stopper layer 18 formed of a non-magnetic layer is formed on the insulating film 17 and first MTJ element 16 by use of a sputtering method, for example. Next, a second TMR material layer 19 is formed on the etching stopper layer 18. Like the first TMR material layer 14, in the case of the single tunnel junction structure, the second TMR material layer 19 is formed of three layers including a magnetically fixed layer 31, tunnel junction layer 32 and magnetic recording layer 33, for example. In this case, it is preferable to form the second TMR material layer 19 by use of a material different from that of the first TMR material layer 14 and the film thickness of the tunnel junction layer 32 of the second TMR material layer 19 may be made different from that of the tunnel junction layer 32 of the first TMR material layer 14. Then, a hard mask 20 formed of a DLC film, for example, is formed on the second TMR material layer 19.

Figure 8:
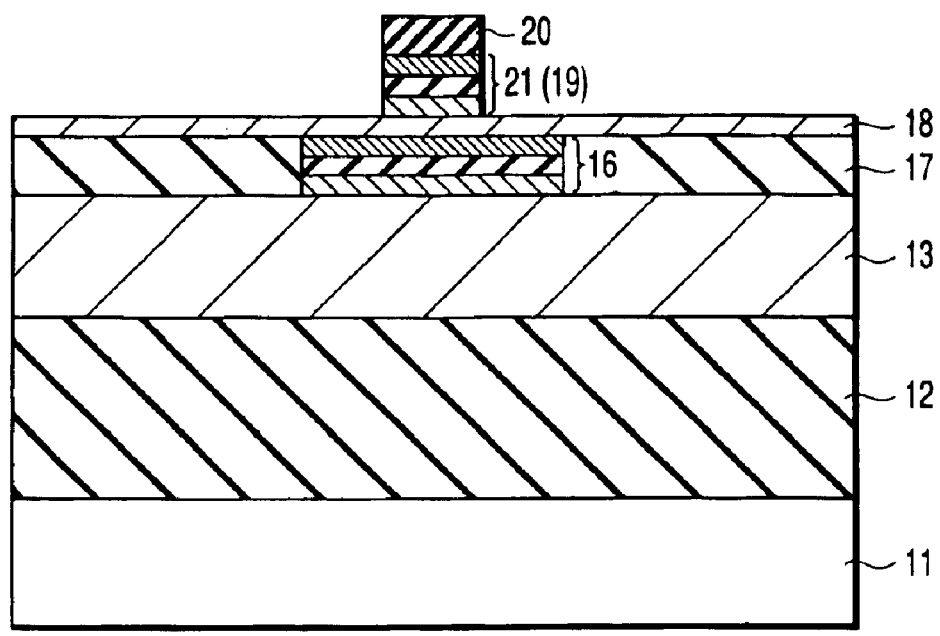

Next, as shown in FIG. 8, the hard mask 20 is patterned by a lithography or etching process. After this, the second TMR material layer 19 is selectively removed by performing an RIE process or ion milling process by use of the patterned hard mask 20 with the etching stopper 18 used as a stopper, so as to form a second MTJ element 21. Then, the patterned hard mask 20 is removed.

Figure 9:
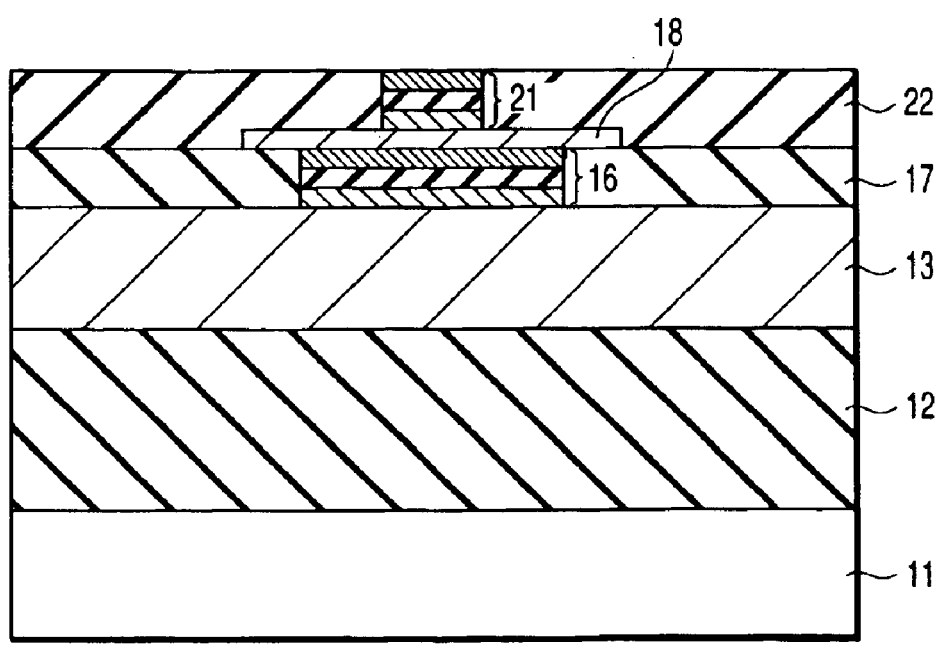

Next, as shown in FIG. 9, the etching stopper 18 is patterned by use of a lithography or etching process. At this time, for example, the etching stopper 18 is patterned to leave behind an area larger than the areas of the first and second MTJ elements 16, 21. Then, an insulating film 22 is formed on the insulating film 17, etching stopper 18 and second MTJ element 21 and the insulating film 22 is made flat until the surface of the second MTJ element 21 is exposed.

Figure 10:
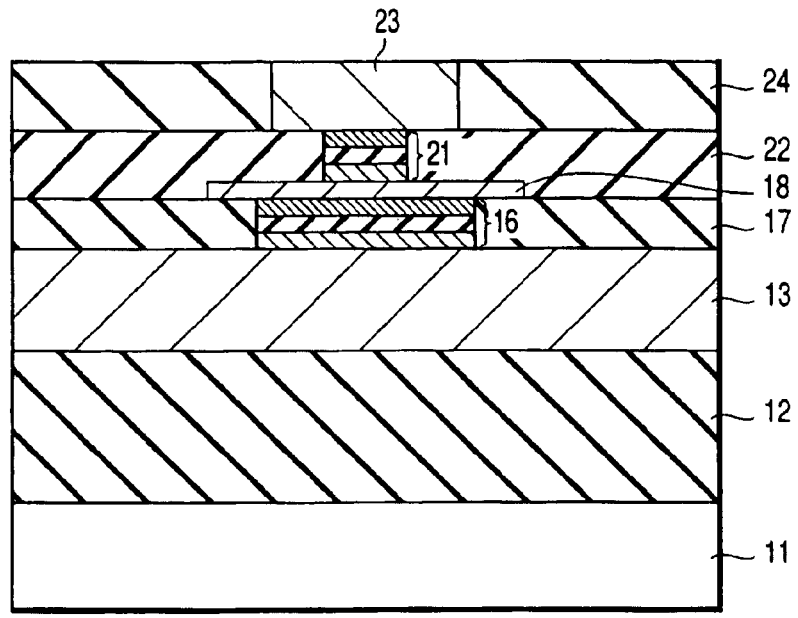

Next, as shown in FIG. 10, a second wiring 23 is formed on the second MTJ element 21 and insulating film 22. Then, an insulating film 24 is formed on the second wiring 23 and insulating film 22 and a surrounding space portion of the second wiring 23 is filled with the insulating film 24. After this, the surface of the insulating film 24 is made flat until the surface of the second wiring 23 is exposed.

In order to uniformly arrange the magnetization directions of the magnetically fixed layers 31 of the first and second MTJ elements 16, 21, a magnetic field of approximately several thousand Oe (oersted) is applied in a vacuum and the annealing process is performed at a temperature of several hundred degrees. In this case, in order to set the magnetization directions of the magnetically fixed layers 31 of the two MTJ elements 16, 21 to different directions from each other, the annealing process is performed as follows. As described above, the first and second MTJ elements 16, 21 are formed of different materials. First, a magnetic field of a first direction is applied to the first MTJ element 16 whose magnetization direction can be arranged at high temperatures and the annealing process is performed at high temperatures to fix the magnetization direction of the first MTJ element 16. Then, a magnetic field of a second direction is applied to the second MTJ element 21 whose magnetization direction can be arranged only at low temperatures and the annealing process is performed at low temperatures to fix the magnetization direction of the second MTJ element 21.

A concrete method for fixing the magnetization directions of the magnetically fixed layers 31 of the first and second MTJ elements 16, 21 to different directions from each other is explained below.

The blocking temperature becomes different depending on the material of an anti-ferromagnetic layer used to configure the magnetically fixed layer 31. For example, when the material of the anti-ferromagnetic layer is Ni—Mn, the blocking temperature is set at 430° C., when it is Pt—Mn, the blocking temperature is set at 350° C., when it is Ir—Mn, the blocking temperature is set at 260° C., and when it is Fe—Mn, the blocking temperature is set at 150° C. Therefore, the magnetization directions of the magnetically fixed layers 31 of the first and second MTJ elements 16, 21 can be set to different directions by utilizing the difference in the blocking temperatures.

First, a first magnetic tunnel junction (first MTJ element 16) is formed. More specifically, a first laminated film configured by a magnetically fixed layer 31 having an anti-ferromagnetic layer formed of Pt—Mn, tunnel junction layer 32 and magnetic recording layer 33 is deposited on the first wiring 13. Then, the first laminated film is processed by use of the ion milling method so that the easy axis will become longer in a desired magnetization direction. After this, an SiOx film is deposited as an inter-level insulating film on the entire surface by use of an RF sputtering method, for example. The SiOx film is made flat to expose the upper surface of the first magnetic tunnel junction.

Next, a second magnetic tunnel junction (second MTJ element 21) is formed. More specifically, a second laminated film configured by a magnetically fixed layer 31 having an anti-ferromagnetic layer formed of Ir—Mn, tunnel junction layer 32 and magnetic recording layer 33 is deposited above the first magnetic tunnel junction. Then, the second laminated film is processed by use of the ion milling method so that the easy axis will become longer in a desired magnetization direction. At this time, the directions of the easy axes of the first and second magnetic tunnel junctions are set to different directions from each other.

After this, while a magnetic field of several thousand Oe is being applied in a direction of the easy axis of the first magnetic tunnel junction, the substrate is heated at a temperature of 350° C.+α to fix the magnetization direction of the magnetically fixed layer 31. Then, while a magnetic field of several thousand Oe is being applied in a direction of the easy axis of the second magnetic tunnel junction, the substrate is heated at a temperature of 260° C.+α to fix the magnetization direction of the magnetically fixed layer 31 which is different from that in the case of the first magnetic tunnel junction.

The directions of the easy axes of the magnetic recording layers 33 in the first and second magnetic tunnel junctions are set depending on the anisotropy of the shape. By use of the above process, it becomes possible to laminate the magnetic tunnel junctions having the easy axes of different directions.

As described above, it is preferable to perform the annealing process for fixing the magnetization directions of the first and second MTJ elements 16, 21 at the last time after various elements up to the second wiring 23 have been formed. This is because there occurs a possibility that various processes performed after the annealing process will adversely affect the fixed magnetization if the annealing process is performed in the course of the whole process. However, if adverse affects on the fixed magnetization can be prevented, it is possible to perform the annealing process for fixing the magnetization directions of the first and second MTJ elements 16, 21 at time other than the last time.

Figure 11:
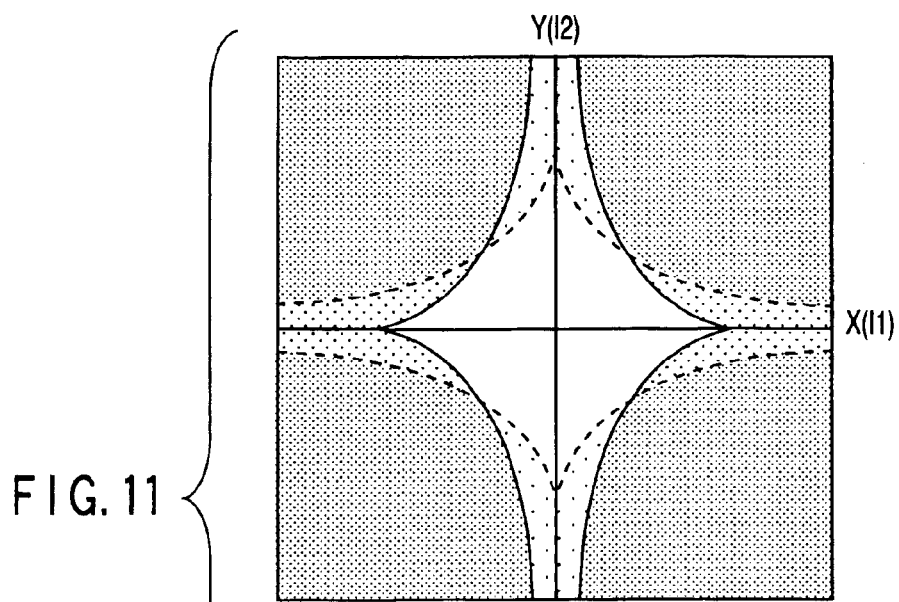
FIG. 11 is a diagram showing asteroid curves of the magnetic memory device according to the first embodiment of the present invention.

FIG. 11 shows asteroid curves of the magnetic memory device according to the first embodiment of the present invention. The write method in the magnetic memory device according to the first embodiment is explained below.

Since the directions of the axes 16a, 21a of easy magnetization of the first and second MTJ elements 16, 21 are different from each other, current values of write currents for inverting the magnetization directions become different. That is, in FIG. 11, if a value I1 of a write current caused to flow in the first wiring 13 is indicated on the abscissa (X axis) and a value I2 of a write current caused to flow in the second wiring 23 is indicated on the ordinate (Y axis), the threshold value of a write current required for the first MTJ element 16 is indicated by an asteroid curve of broken lines, and the threshold value of a write current required for the second MTJ element 21 is indicated by an asteroid curve of solid lines. By causing currents of current values lying in areas outside an area defined by the asteroid curves to flow into the first and second wirings 13, 23, data can be written into the MTJ elements 16, 21.

Generally, since the inverted threshold value of magnetization of the MTJ element is smaller in the direction of the easy axis than in the direction of the hard axis, the asteroid curves of the first and second MTJ elements 16, 21 are asymmetrical with respect to the X, Y directions. That is, the asteroid curves of the first and second MTJ elements 16, 21 are rotated by an angle of 90 degrees from each other and do not overlap each other. Based on this fact, in the first embodiment of the present invention, data can be selectively written into one of the first and second MTJ elements 16, 21.

That is, if a current in a first current area is caused to flow in the first and second wirings 13, 23, only the magnetization of the first MTJ element 16 is inverted and data can be written only in the first MTJ element 16. Further, if a current in a second current area is caused to flow in the first and second wirings 13, 23, only the magnetization of the second MTJ element 21 is inverted and data can be written only in the second MTJ element 21. If a current in a third current area is caused to flow in the first and second wirings 13, 23, the magnetizations of the first and second MTJ elements 16, 21 are both inverted and data can be written in both of the first and second MTJ elements 16, 21. Thus, by selectively setting the write current which is caused to flow in the first and second wirings 13, 23, data can be selectively written into the two MTJ elements 16, 21 by use of a pair of write wirings 13, 23 and four-value data can be written into one cell.

Figure 12:
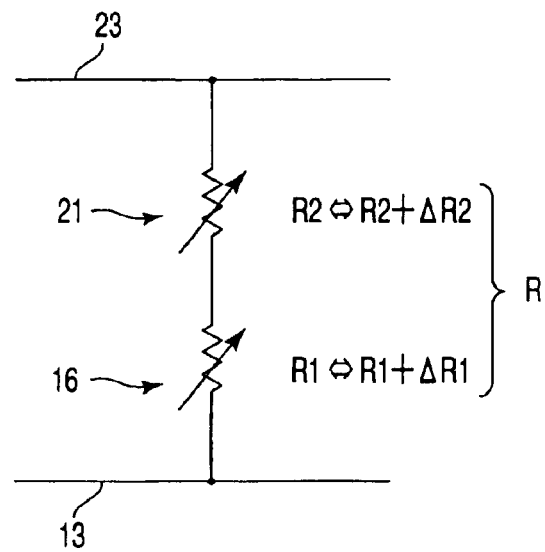
FIG. 12 is an equivalent circuit diagram showing an equivalent circuit of the magnetic memory device according to the first embodiment of the present invention.
Figure 13:
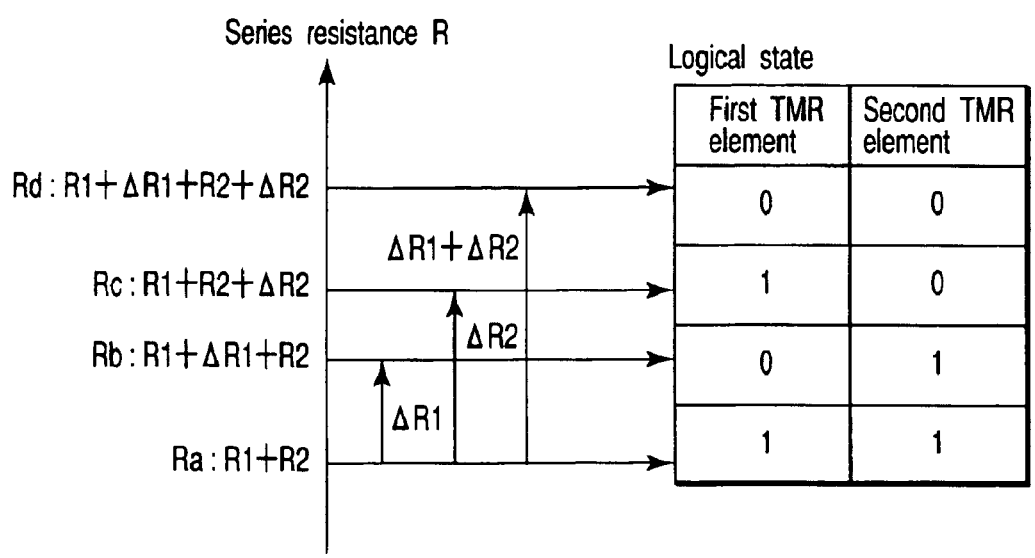
FIG. 13 is a diagram for illustrating the readout operation of the magnetic memory device according to the first embodiment of the present invention.

FIG. 12 is an equivalent circuit diagram showing an equivalent circuit of the magnetic memory device according to the first embodiment of the present invention. FIG. 13 is an explanatory diagram for illustrating the readout operation of the magnetic memory device according to the first embodiment of the present invention. The readout method of the magnetic memory device according to the first embodiment is explained below.

As shown in FIG. 12, a memory cell in the magnetic memory device according to the first embodiment is configured by serially connecting the first and second MTJ elements 16, 21. In this case, the resistances of the first and second MTJ elements 16, 21 are changed at the time of the "1" state and at the time of the "0" state. If the resistance at the time of the "1" state is R1 and the resistance at the time of the "0" state is R1+ΔR1 in the first MTJ element 16 and the resistance at the time of the "1" state is R2 and the resistance at the time of the "0" state is R2+ΔR2 in the second MTJ element 21, then the series resistance R of the memory cell becomes equal to the sum of the resistance (R1 or R1+ΔR1) of the first MTJ element 16 and the resistance (R2 or R2+ΔR2) of the second MTJ element 21.

Therefore, as shown in FIG. 13, the series resistance of the two MTJ elements 16, 21 is set to one of the four values according to the recording states of the first and second MTJ elements 16, 21.

First, assume that "1" data has been written in each of the first and second MTJ elements 16, 21. In this case, the series resistance Ra of the memory cell is set to a value obtained by adding together the resistances R1, R2 of the first and second MTJ elements 16, 21, that is, R1+R2. Next, if data is written only into the first MTJ element 16, for example, the resistance of the first MTJ element 16 is changed to R1+ΔR1. Therefore, in this case, the series resistance Rb of the memory cell is set to R1+ΔR1+R2. Further, if data is written only into the second MTJ element 21, for example, the resistance of the second MTJ element 21 is changed to R2+ΔR2. Therefore, in this case, the series resistance Rc of the memory cell is set to R1+R2+ΔR2. If data is written into both of the first and second MTJ elements 16, 21, for example, the resistance of the first MTJ element 16 is changed to R1+ΔR1 and the resistance of the second MTJ element 21 is changed to R2+ΔR2. Therefore, in this case, the series resistance Rd of the memory cell is set to R1+ΔR1+R2+ΔR2.

As described above, four-value data can be read out. That is, if the resistance R of the selected memory cell when the readout current is caused to flow is Ra, for example, "1" data is written in the first and second MTJ elements 16, 21, and if it is Rb, for example, "0" data is written in the first MTJ element 16 and "1" data is written in the second MTJ element 21. Further, if the resistance R of the selected memory cell is Rc, for example, "1" data is written in the first MTJ element 16 and "0" data is written in the second MTJ element 21, and if it is Rd, for example, "0" data is written in the first and second MTJ elements 16, 21.

In order to make it possible to read out four-value data, it is indispensable to create resistances having four different values. That is, in order to create the series resistances Rb, Rc, the necessary condition that ΔR1, ΔR2 are set to different values must be satisfied. As described above, the above condition can be easily satisfied by, for example, forming the tunnel junction layers 32 in the first and second MTJ elements 16, 21 with different film thicknesses to change the values of R1 and R2 or forming the tunnel junction layers 32 by use of different materials to change the MR ratios.

According to the first embodiment, the first and second MTJ elements 16, 21 are laminated between the first and second wirings 13, 23 without overlapping the directions of the easy axes each other (without setting the easy axes in the same direction). By adequately adjusting the readout current and selectively writing data into the first and second MTJ elements 16, 21, four-value data can be written. Further, since four-value series resistances Ra, Rb, Rc, Rd can be created by setting the resistance change amounts ΔR1, ΔR2 of the first and second MTJ elements 16, 21 to different values, four-value data can be read out. As described above, since four-value data can be recorded and read out for each bit, the integration density of the memory can be greatly enhanced.

[Second Embodiment]

In the second embodiment, an example is shown in which two MTJ elements are laminated in each cell with the directions of the easy axes of magnetization (easy axes) thereof being not overlapped and a rectifier element is used as a switching element.

Figure 14:
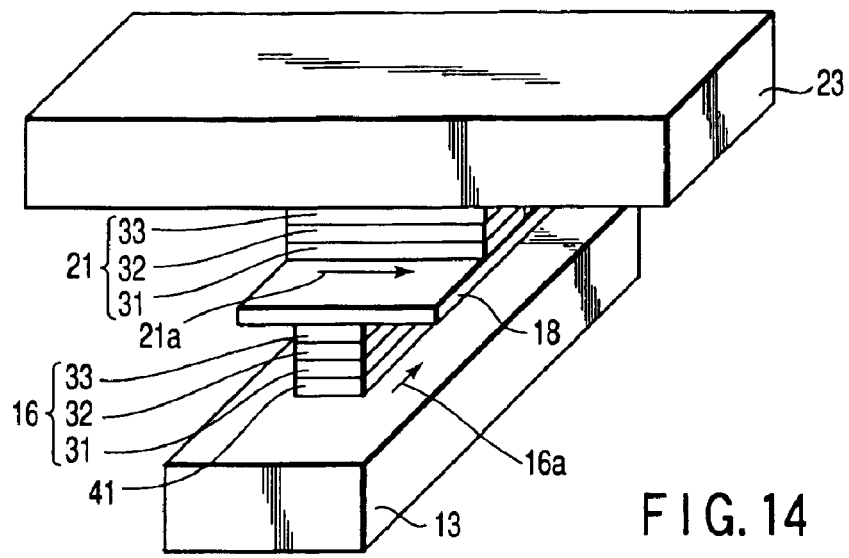
FIG. 14 is a perspective view showing a magnetic memory device according to a second embodiment of the present invention.

FIG. 14 is a perspective view showing a magnetic memory device according to the second embodiment of the present invention. The configuration of the magnetic memory device according to the second embodiment of the present invention is explained below.

As shown in FIG. 14, the second embodiment is similar to the first embodiment except that a diode element 41 is used as a readout switching element. That is, the magnetic memory device according to the second embodiment includes first and second wirings 13, 23 which are arranged to extend in different directions from each other, first and second MTJ elements 16, 21 sandwiched between the first and second wirings 13 and 23, and the diode element 41 disposed between the first MTJ element 16 and the first wiring 13. The first and second MTJ elements 16, 21 are arranged with the easy axes thereof set in different directions. The other portions of the configuration are similar to those in the first embodiment and the explanation thereof is omitted.

Figure 15:
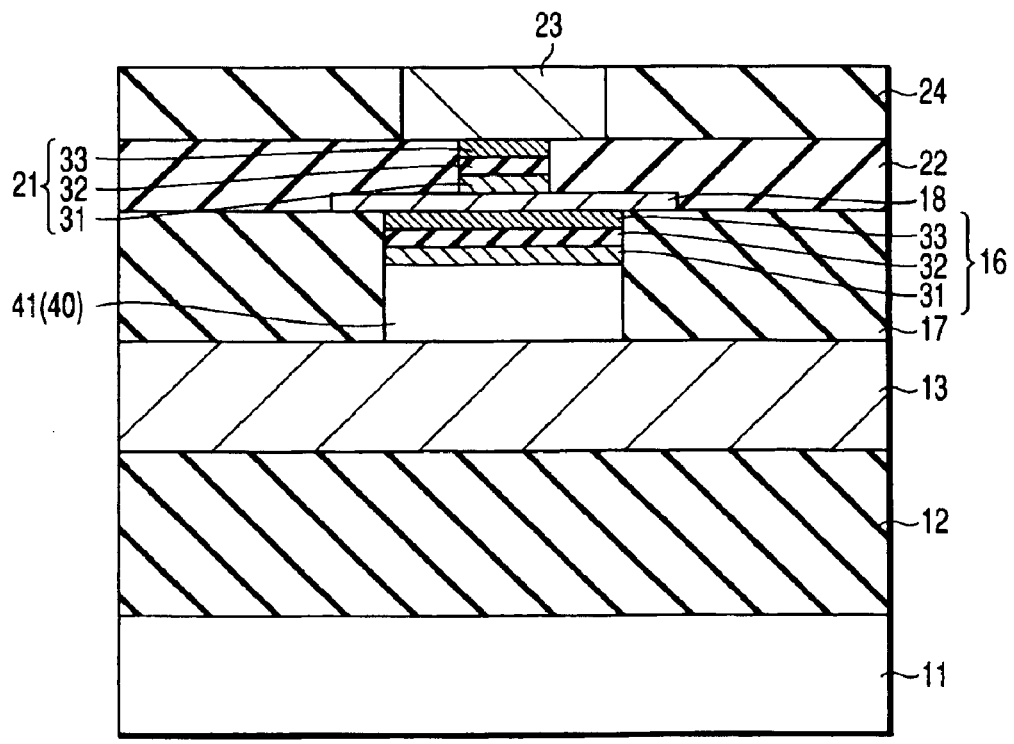
FIG. 15 is a cross sectional view showing the magnetic memory device according to the second embodiment of the present invention.

FIG. 15 is a cross sectional view showing the magnetic memory device according to the second embodiment of the present invention. The manufacturing method of the magnetic memory device according to the second embodiment is explained below.

First, as shown in FIG. 15, a first wiring 13 is formed above a semiconductor substrate 11 with an insulating film 12 or the like disposed therebetween and a diode material layer 40 is formed on the first wiring 13. A first TMR material layer 14 is formed on the diode material layer 40. In the case of the single tunnel junction structure, for example, the first TMR material layer 14 is formed of three layers including a magnetically fixed layer 31, tunnel junction layer 32 and magnetic recording layer 33. Then, a hard mask 15 which is formed of a DLC film, for example, is formed on the first TMR material layer 14 and patterned. After this, the first TMR material layer 14 and diode material layer 40 are selectively removed by performing an RIE process or ion milling process by use of the patterned hard mask 15 so as to form a first MTJ element 16 and diode element 41. Then, the patterned hard mask 15 is removed. Next, an insulating film 17 is formed on the first MTJ element 16 and first wiring 13 and a surrounding portion of the first MTJ element 16 and diode element 41 is filled with the insulating film 17. Since the process performed after this is the same as that in the first embodiment, the explanation thereof is omitted.

As described above, in the second embodiment, like the first embodiment, first to third current areas are set based on asteroid curves of the first and second MTJ elements 16, 21 as shown in FIG. 11. Data is selectively written into the first and second MTJ elements 16, 21 by selecting a write current from the first to third current areas. Further, at the data readout time, a readout current is caused to flow into the first and second MTJ elements 16, 21 and write data is determined based on the series resistances of the first and second MTJ elements 16, 21. In the second embodiment, since the diode element 41 is used as the switching element, a readout current can be easily caused to flow only into a selected cell by bias adjustment at the data readout time.

According to the second embodiment, the same effect as that in the first embodiment can be attained.

Further, a current can be easily caused to flow only into a selected cell by bias adjustment by inserting the diode element 41 between the first MTJ element 16 and the first wiring 13. Therefore, data readout precision can be significantly enhanced and the readout speed can be enhanced.

[Third Embodiment]

In the third embodiment, an example is shown in which two MTJ elements are laminated in each cell without overlapping the directions of the easy axes of magnetization (easy axes) thereof, and a transistor is used as a switching element.

Figure 16:
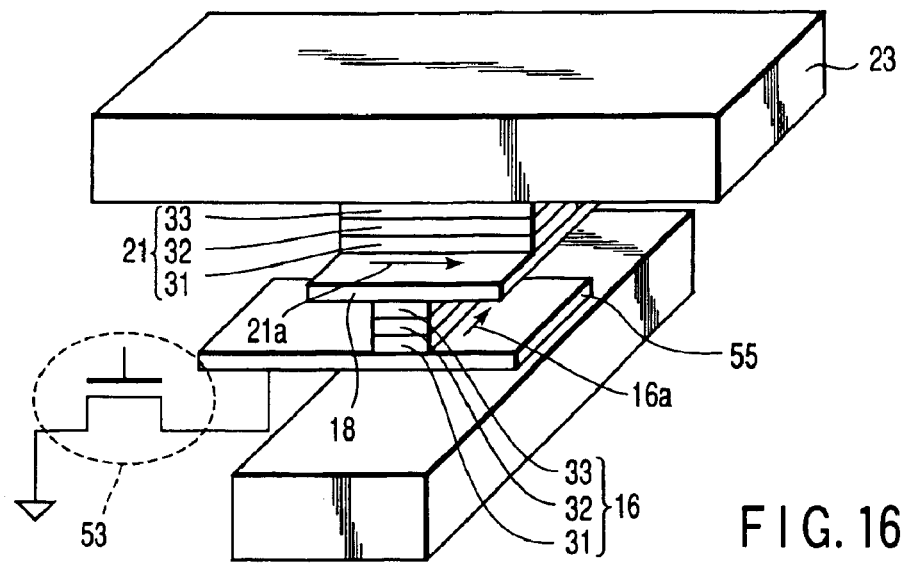
FIG. 16 is a perspective view showing a magnetic memory device according to a third embodiment of the present invention.

FIG. 16 is a perspective view showing a magnetic memory device according to the third embodiment of the present invention. The configuration of the magnetic memory device according to the third embodiment of the present invention is explained below.

As shown in FIG. 16, the third embodiment is similar to the first embodiment except that a MOS transistor 53 is used as a readout switching element. That is, the magnetic memory device according to the third embodiment includes first and second wirings 13, 23 which are arranged to extend in different directions from each other, first and second MTJ elements 16, 21 sandwiched between the first and second wirings 13 and 23, and the MOS transistor 53 connected to the first MTJ element 16 via a lower electrode 55. The lower electrode 55 is disposed apart from the first wiring 13. The first and second MTJ elements 16, 21 are arranged with the easy axes thereof set in different directions. The other portions of the configuration are similar to those in the first embodiment and the explanation thereof is omitted.

Figure 17:
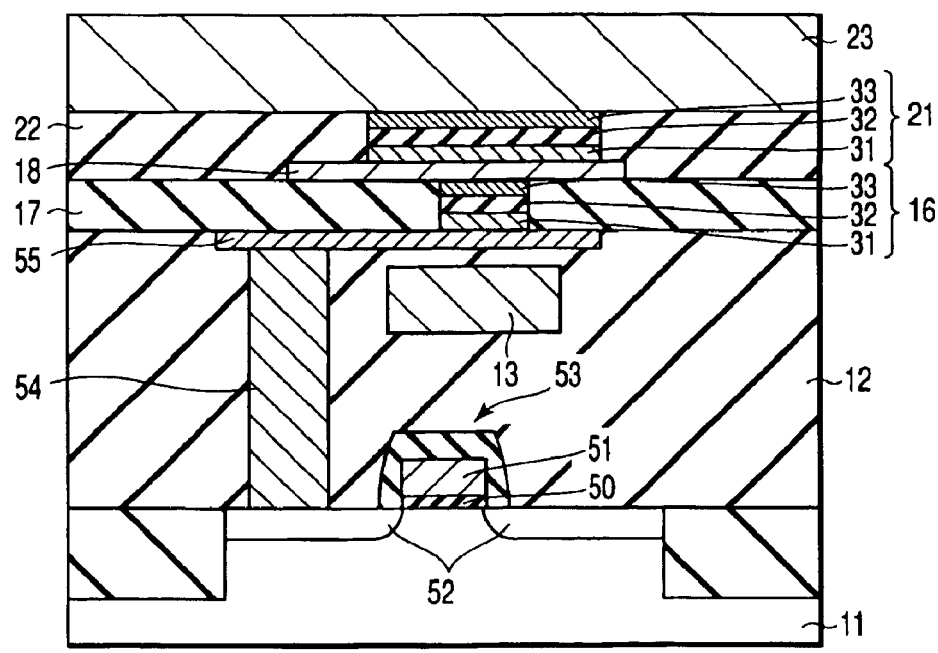
FIG. 17 is a cross sectional view showing the magnetic memory device according to the third embodiment of the present invention.

FIG. 17 is a cross sectional view showing the magnetic memory device according to the third embodiment of the present invention. The manufacturing method of the magnetic memory device according to the third embodiment is explained below.

First, as shown in FIG. 17, a gate electrode 51 is selectively formed above a semiconductor substrate 11 with a gate insulating film 50 disposed therebetween and source/drain diffusion layers 52 are formed in the surface areas of the semiconductor substrate 11 on both sides of the gate electrode 51. Thus, a MOS transistor 53 is formed and the gate electrode 51 of the MOS transistor 53 is used as a readout wiring. Then, a contact 54 and first wiring 13 which are respectively connected to the source/drain diffusion layers 52 are formed in an insulating film 12. After this, a lower electrode 55 which is disposed apart from the first wiring 13 and connected to the contact 54 is formed and a first TMR material layer 14 is formed on the lower electrode 55. The process performed after this is the same as that in the first embodiment and the explanation thereof is omitted.

As described above, in the third embodiment, like the first embodiment, first to third current areas are set according to two asteroid curves of the first and second MTJ elements 16, 21 as shown in FIG. 11. Data is selectively written into the first and second MTJ elements 16, 21 by selecting a write current from the first to third current areas. Further, at the data readout time, a readout current is caused to flow into the first and second MTJ elements 16, 21 and write data is determined based on the series resistances of the first and second MTJ elements 16, 21. In the third embodiment, since the MOS transistor 53 is used as the switching element, a readout current can be easily caused to flow only into a selected cell by turning ON the MOS transistor 53 which is connected to the selected cell at the data readout time.

According to the third embodiment, the same effect as that in the first embodiment can be attained.

Further, like the second embodiment, a current can be easily caused to flow only into a selected cell by using the MOS transistor 53 as the readout switching element. Therefore, data readout precision can be significantly enhanced and the readout speed can be enhanced.

The process for the MOS transistor 53 is congenial to the CMOS process which is used in the normal LSI process. That is, since MOS transistors 53 of the memory cell area can be formed at the same time as formation of MOS transistors in the peripheral circuit area, the switching element can be formed without making the process complicated.

[Fourth Embodiment]

In the fourth embodiment, an example is shown in which the easy axes of magnetization (easy axes) of MTJ elements are set in different directions from the extending directions of wirings.

Figure 18:
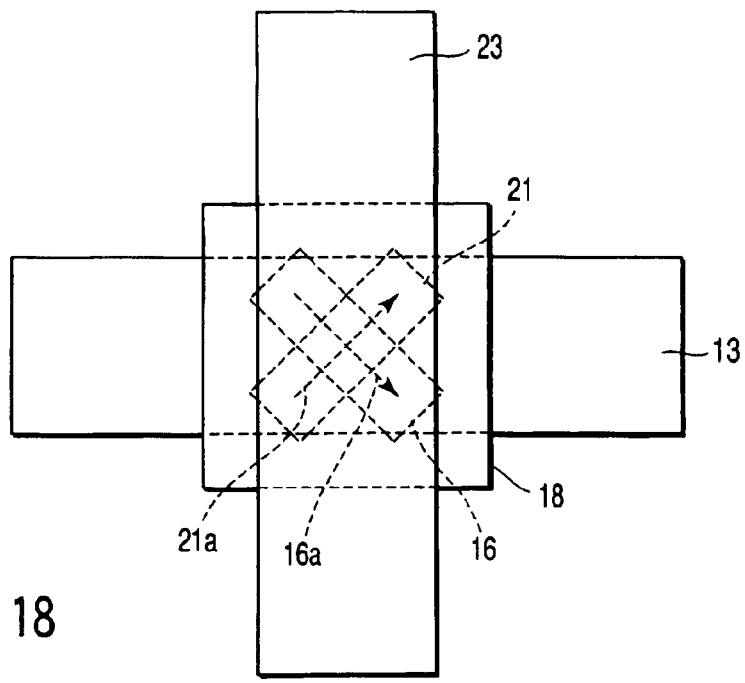
FIG. 18 is a plan view showing a magnetic memory device according to a fourth embodiment of the present invention.
Figure 19:
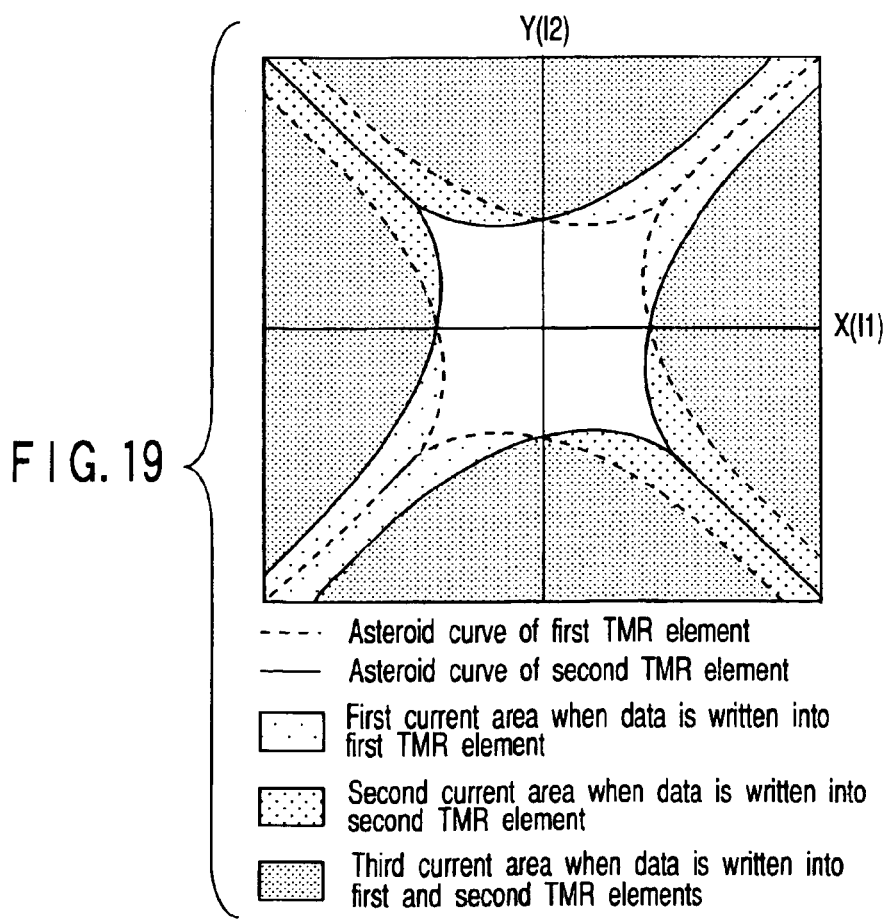
FIG. 19 is a diagram showing asteroid curves of the magnetic memory device according to the fourth embodiment of the present invention.

FIG. 18 is a plan view showing a magnetic memory device according to the fourth embodiment of the present invention. FIG. 19 shows asteroid curves of the magnetic memory device according to the fourth embodiment of the present invention. The magnetic memory device according to the fourth embodiment is explained below. In the fourth embodiment, only portions different from those of the first embodiment are explained.

As shown in FIG. 18, the fourth embodiment is similar to the first embodiment except that easy axis directions 16a, 21a of first and second MTJ elements 16, 21 are rotated or deviated with respect to the extending directions of first and second wirings 13, 23. More specifically, the easy axis direction 16a of the first MTJ element 16 is rotated by an angle of 45 degrees in a clockwise direction with respect to the extending direction of first wiring 13 and the easy axis direction 21a of the second MTJ element 21 is rotated by an angle of 45 degrees in a clockwise direction with respect to the extending direction of second wiring 23. Also, in this case, like the first embodiment, since the first and second wirings 13, 23 are arranged to cross at right angles, the easy axis direction 16a of the first MTJ element 16 and the easy axis direction 21a of the second MTJ element 21 cross at right angles.

Thus, in the fourth embodiment, the configuration in which the first and second MTJ elements 16, 21 are rotated by an angle of 45 degrees in a clockwise direction in comparison with those of the first embodiment can be attained. Therefore, as shown in FIG. 19, the asteroid curves in the fourth embodiment are obtained by rotating the asteroid curves in the first embodiment by 45 degrees in a clockwise direction. That is, in the first embodiment, a relatively large current is required to flow into one of the first and second wirings 13, 23 when data is written into only one of the first and second MTJ elements 16, 21. However, in the fourth embodiment, currents with almost the same value are caused to flow into the first and second wirings 12, 23.

As described above, in the fourth embodiment, first to third current areas are set based on the two asteroid curves of the first and second MTJ elements 16, 21 as shown in FIG. 19. Then, data is selectively written into the first and second MTJ elements 16, 21 by selecting a write current from the first to third current areas. Further, at the data readout time, a readout current is caused to flow into the first and second MTJ elements 16, 21 and write data is determined based on the series resistances of the first and second MTJ elements 16, 21.

According to the fourth embodiment, the same effect as that in the first embodiment can be attained.

Further, in the fourth embodiment, currents with almost the same value are caused to flow into the first and second wirings 12, 23 when data is written into only one of the first and second MTJ elements 16, 21. Therefore, the magnitude of a load applied to one of the first and second wirings 13, 23 when the write currents are caused to flow therein can be suppressed in comparison with the case of the first embodiment.

Further, the rotation angles of the easy axis directions 16a, 21a of first and second MTJ elements 16, 21 with respect to the extending directions of first and second wirings 13, 23 are not limited to 45 degrees and can be varied.

It is also possible to combine the configuration of the fourth embodiment with the switching element shown in the second and third embodiments.

[Fifth Embodiment]

In the fifth embodiment, an example is shown in which three or more MTJ elements are laminated in each cell with the directions of the easy axes thereof being not overlapped (with the easy axes being not set in the same direction).

FIG. 20 is a plan view showing a magnetic memory device according to the fifth embodiment of the present invention. The magnetic memory device according to the third embodiment is explained below. In the fifth embodiment, only portions which are different from those of the first embodiment are explained.

As shown in FIG. 20, the fifth embodiment is similar to the first embodiment except that four MTJ elements 16, 21, 60, 61 are laminated in each cell without overlapping the easy axis directions 16a, 21a, 60a, 61a thereof. That is, the first MTJ element 16 is arranged with the easy axis direction 16a set to the extending direction of the first wiring 13 and the second MTJ element 21 is arranged while the easy axis direction 21a thereof is rotated by an angle of 45 degrees in a counterclockwise direction with respect to the easy axis direction 16a of the first MTJ element 16. The third MTJ element 60 is arranged while the easy axis direction 60a thereof is set to a direction rotated by an angle of 45 degrees in a counterclockwise direction with respect to the easy axis direction 21a of the second MTJ element 21 or to the extending direction of the second wiring 23. Further, the fourth MTJ element 61 is arranged while the easy axis direction 61a thereof is set to a direction rotated by an angle of 45 degrees in a counterclockwise direction with respect to the easy axis direction 60a of the third MTJ element 60. The first to fourth MTJ elements 16, 21, 60, 61 are sequentially laminated between the first and second wirings 13 and 23. Further, etching stopper layers 18 each formed of a non-magnetic layer are respectively formed between the first and second MTJ elements 16 and 21, between the second and third MTJ elements 21 and 60, and between the third and fourth MTJ elements 60 and 61.

In the above-described fifth embodiment, a plurality of current areas are set based on asteroid curves of the first to fourth MTJ elements 16, 21, 60, 61. Data is selectively written into the first to fourth MTJ elements 16, 21, 60, 61 by selecting a write current from the above current areas. Further, at the data readout time, a readout current is caused to flow into the first to fourth MTJ elements 16, 21, 60, 61 and write data is determined based on the series resistances of the first to fourth MTJ elements 16, 21, 60, 61. In the fifth embodiment, an MRAM which holds 16-value data for each bit can be realized.

In order to hold 16-value data for each bit, it is necessary to set resistance change amounts $\Delta R1, \Delta R2, \Delta R3, \Delta R4$ in the "1", "0" states of the first to fourth MTJ elements 16, 21, 60, 61 to respective different values. As described in the first embodiment, for example, this can be attained by setting the film thicknesses of tunnel junction layers of the first to fourth MTJ elements 16, 21, 60, 61 to different values, forming the first to fourth MTJ elements 16, 21, 60, 61 by use of different materials or forming the first to fourth MTJ elements 16, 21, 60, 61 of different sizes.

Further, the magnetic memory device according to the fifth embodiment can be formed in the same manner as in the first embodiment by laminating the first to fourth MTJ elements 16, 21, 60, 61. In this case, the annealing process in the magnetic field performed when the magnetization directions of the first to fourth MTJ elements 16, 21, 60, 61 are fixed is performed at different temperatures in the order of the first MTJ element 16, second MTJ element 21, third MTJ element 60 and fourth MTJ element 61. It is desirable that the annealing temperature in this case is set lower for the MTJ element of an upper layer.

According to the fifth embodiment, the same effect as that in the first embodiment can be attained.

Further, in the fifth embodiment, 16-value data can be written and read out for each bit by laminating the four MTJ elements 16, 21, 60, 61 in each cell without overlapping the easy axis directions 16a, 21a, 60a, 61a thereof. Therefore, the integration density of the memory can be further enhanced.

Five or more MTJ elements can be laminated in each cell without overlapping the easy axis directions thereof. For example, when n MTJ elements are laminated, 2n-value data can be written and read out for each bit by arranging the n MTJ elements which are each rotated by an angle of 180 degrees/n with respect to the adjacent MTJ element.

Further, the configuration of the fifth embodiment can be combined with the switching element shown in the second and third embodiments and the easy axis directions of the MTJ elements can be set so as not to overlap the extending directions of the first and second wirings as in the fourth embodiment.

[Sixth Embodiment]

In the sixth embodiment, the directions of wirings and adjacent easy axes respectively cross at right angles with each other.

Figure 22:
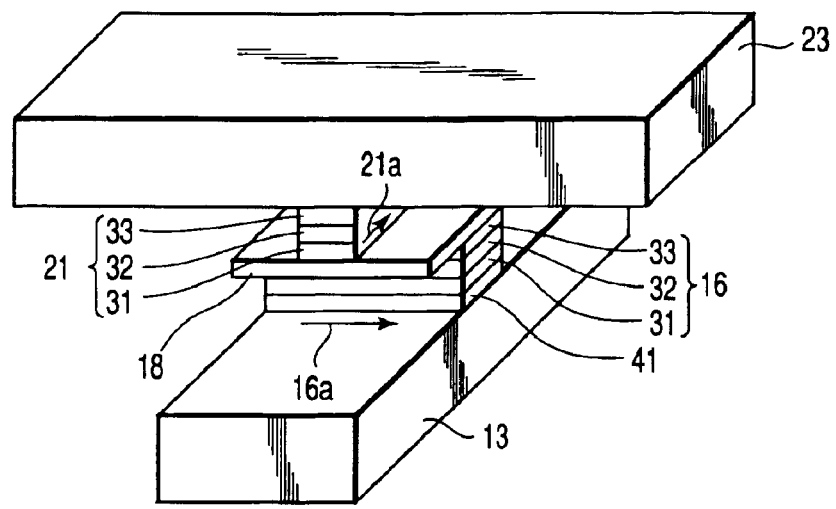
FIG. 22 is a perspective view showing a magnetic memory device having a readout switching diode according to the sixth embodiment of the present invention.
Figure 23:
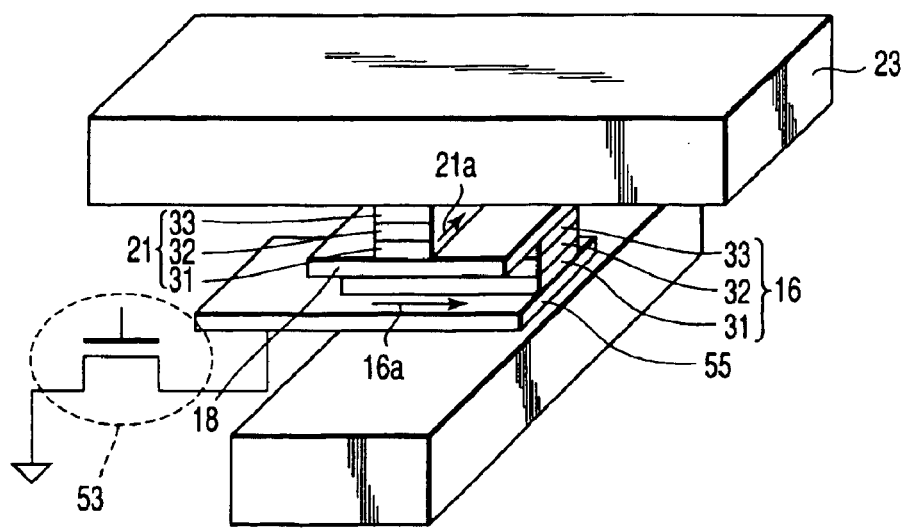
FIG. 23 is a perspective view showing a magnetic memory device having a readout switching transistor according to the sixth embodiment of the present invention.

FIG. 21 is a perspective view showing a magnetic memory device having no switching element according to the sixth embodiment of the present invention. FIG. 22 is a perspective view showing a magnetic memory device having a readout switching diode according to the sixth embodiment of the present invention. FIG. 23 is a perspective view showing a magnetic memory device having a readout switching transistor according to the sixth embodiment of the present invention. The configuration of the magnetic memory device according to the sixth embodiment of the present invention is explained below.

As shown in FIGS. 21 to 23, the sixth embodiment is similar to the first embodiment except that an easy axis direction 16a of a first MTJ element 16 arranged adjacent to and directly on a first wiring 13 is rotated or deviated by an angle of 90 degrees with respect to the extending direction of the first wiring 13 and an easy axis direction 21a of a second MTJ element 21 arranged adjacent to and directly under a second wiring 23 is rotated by an angle of 90 degrees with respect to the extending direction of the second wiring 23. That is, the configuration in which the directions of the wirings and the adjacent easy axes respectively cross at right angles with each other is provided.

Like the first to third embodiments, in the above-described sixth embodiment, first to third current areas are set based on two asteroid curves of first and second MTJ elements 16, 21 as shown in FIG. 11. Data is selectively written into the first and second MTJ elements 16, 21 by selecting a write current from the first to third current areas. Further, at the data readout time, a readout current is caused to flow into the first and second MTJ elements 16, 21 and write data is determined based on the series resistances of the first and second MTJ elements 16, 21.

According to the respective drawings of the above sixth embodiment, the same effect as that in each of the first to third embodiments can be attained and the following effect is additionally attained.

In the first to third embodiments, the configuration in which the directions of the wirings and adjacent easy axes are respectively set in parallel is provided. Therefore, since the write wiring can be made thin, the distance between adjacent cells can be made small. As a result, the configuration which is advantageous in miniaturizing the cells can be attained.

On the other hand, in the sixth embodiment, the configuration in which the directions of the wirings and adjacent easy axes respectively cross at right angles with each other is provided. Therefore, since a magnetic field in the easy axis direction can be applied by use of the closest wiring, magnetization of the cell can be easily inverted and the configuration which is advantageous in reducing the write current can be attained. For example, when data is written into a selected cell, a magnetic field which is stronger in the easy axis direction than in the hard axis direction is applied in the ratio of 1.7:1.0, for example. This ratio varies greatly according to cell structure.

[Seventh Embodiment]

The seventh embodiment is a modification of the first embodiment and shows the configuration having no switching element.

Figure 24:
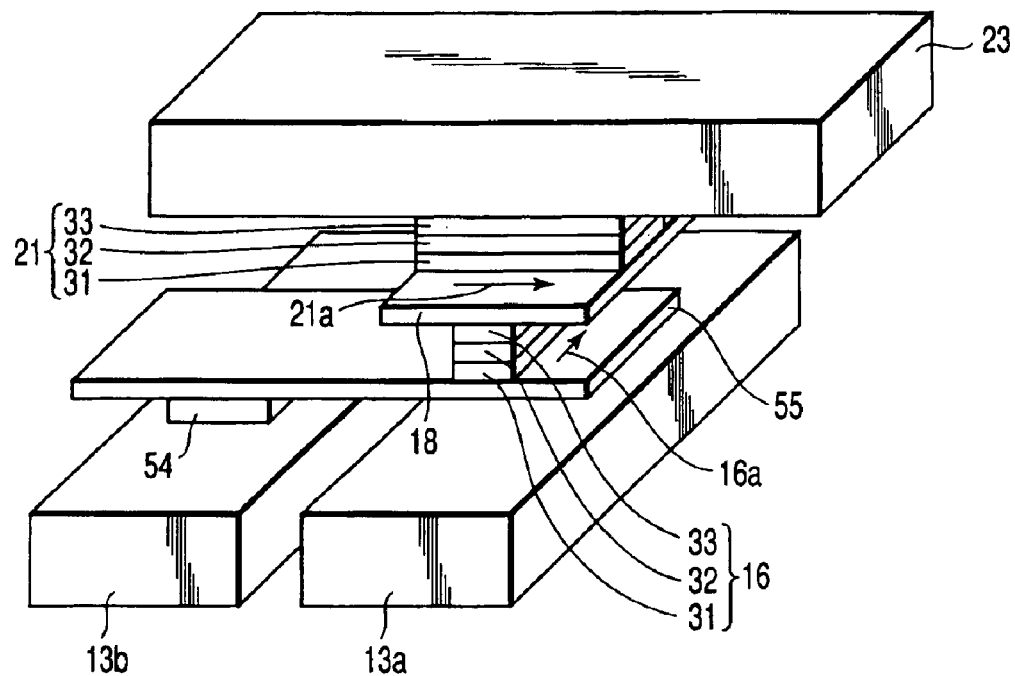
FIG. 24 is a perspective view showing a magnetic memory device having no switching element according to a seventh embodiment of the present invention.
Figure 25:
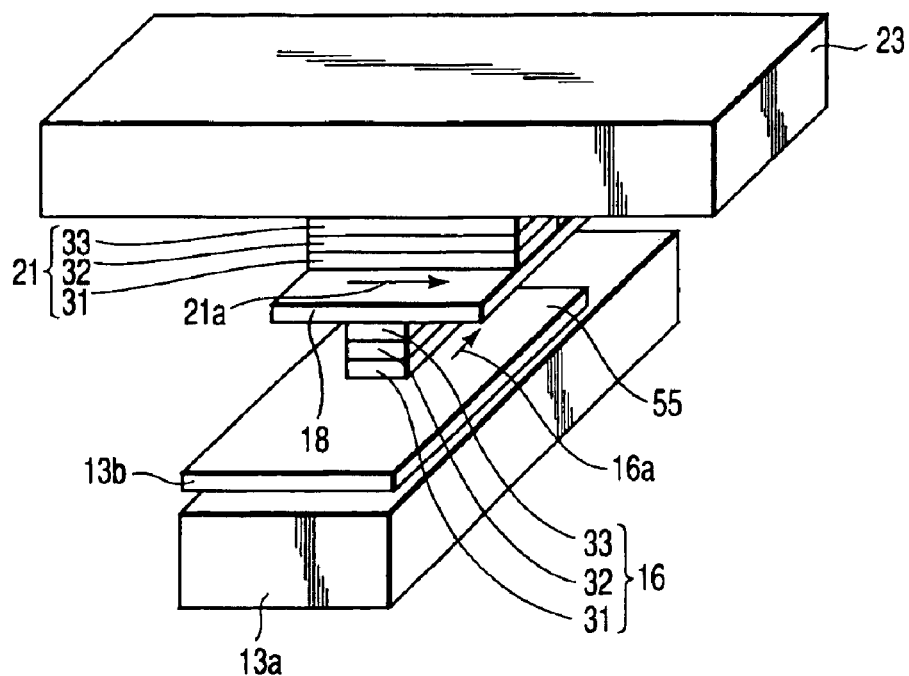
FIG. 25 is a perspective view showing another magnetic memory device having no switching element according to the seventh embodiment of the present invention.
Figure 26:
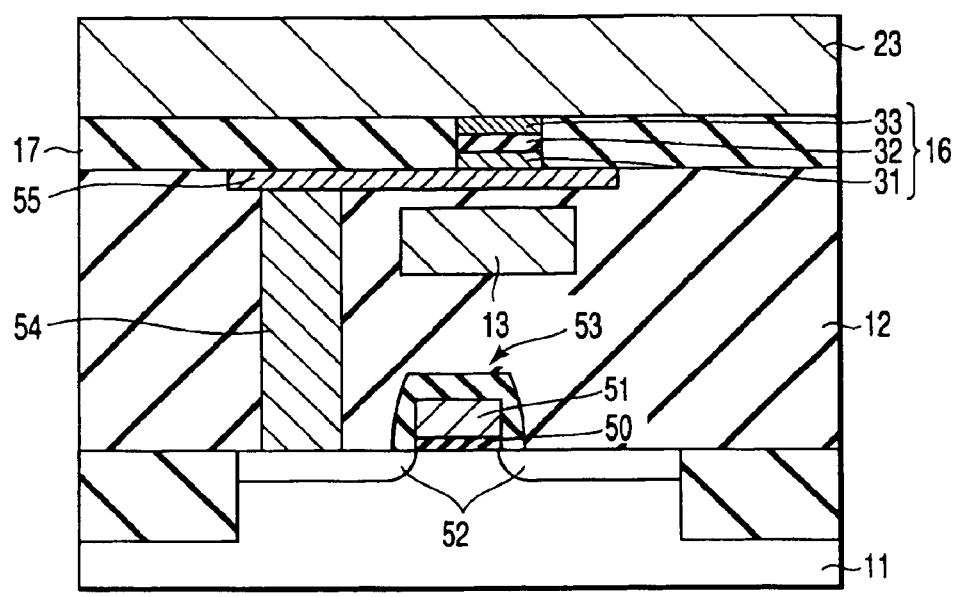
FIG. 26 is a cross sectional view showing a magnetic memory device according to the prior art technique.

FIGS. 24, 25 are perspective views each showing a magnetic memory device having no switching element according to the seventh embodiment of the present invention. The configuration of the magnetic memory device according to the seventh embodiment is explained below. Portions which are different from those of the configuration of the first embodiment are mainly explained.

In the configuration shown in FIG. 24, a first wiring 13 is divided into a write word line 13a and a readout word line 13b. The write word line 13a is disposed apart from a first MTJ element 16 to extend and cross a second wiring (bit line) 23 at right angles, for example. The readout word line 13b is disposed to extend in parallel to the write word line 13a on the same plane and connected to the first and second MTJ elements 16, 21 via a contact 54 and lower electrode 55.

Also, in the configuration shown in FIG. 25, a first wiring 13 is divided into a write word line 13a and a readout word line 13b. The write word line 13a is disposed apart from a first MTJ element 16 to extend and cross a second wiring (bit line) 23 at right angles, for example. The readout word line 13b is disposed to extend in parallel to the write word line 13a, arranged between the first MTJ element 16 and the write word line 13a, and formed in contact with the first MTJ element 16.

According to the seventh embodiment, the same effect as that in the first embodiment can be attained.

Further, in the seventh embodiment, the first wiring 13 is divided into the write word line 13a and the readout word line 13b. Therefore, a large readout signal can be taken out and the readout speed can be enhanced in comparison with the simple cross point structure as in the first embodiment.

Further, since the write line and readout line are partly separated from each other, voltage bias applied to the tunnel junction layer 32 at the write time can be eliminated and the reliability can be enhanced.

In the seventh embodiment, since no switching element is used, the cell size can be reduced and development to a multi-layered structure can be easily attained.

In the first to seventh embodiments, the MTJ element is used as the memory element, but a GMR (Giant Magneto Resistive) element configured by two magnetic layers and a conductive layer sandwiched between the magnetic layers can be used, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   magneto resistive elements which are laminated in each cell with easy axes of magnetization thereof set in different directions, the magneto resistive elements having at least two resistance values, the magneto resistive elements having a first end portion and a second end portion;
   a bit line electrically connected to the first end portion and extended in a first direction;
   a first word line electrically connected to the second end portion and extended in a second direction different from the first direction; and
   a second word line electrically isolated from the first word line and extended in the second direction.

2. The magnetic memory device according to claim 1, wherein the magneto resistive elements include first and second magneto resistive elements,
   the first magneto resistive element is disposed above the second word line and has a first easy axis of magnetization which is set in the second direction,
   the second magneto resistive element is disposed above the first magneto resistive element and has a second easy axis of magnetization set in the first direction.

3. The magnetic memory device according to claim 2, wherein the first easy axis of magnetization is set at an angle of 90 degrees to the second easy axis of magnetization.

4. The magnetic memory device according to claim 2, wherein one of the first and second magneto resistive elements has a single tunnel junction structure having a non-magnetic layer and the other one of the first and second magneto resistive elements has a double tunnel junction structure having two non-magnetic layers.

5. The magnetic memory device according to claim 2, wherein four-value data is read out based on the fact that a first resistance of the first magneto resistive element obtained when data is written into the first magneto resistive element, a second resistance of the second magneto resistive element obtained when data is written into the second magneto resistive element, and a third resistance of the first and second magneto resistive elements obtained when data is written into both of the first and second magneto resistive elements are different from each other.

6. The magnetic memory device according to claim 1, wherein the first word line has a read wiring and the second word line has a write wiring.

7. The magnetic memory device according to claim 1, wherein the first and second word lines are disposed on the same face.

8. The magnetic memory device according to claim 1, wherein the first word line is disposed above the second word line.

9. The magnetic memory device according to claim 1, further comprising a rectifier element or transistor connected to the magneto resistive elements.

10. The magnetic memory device according to claim 1, wherein resistances of the magneto resistive elements are different from each other in the same write-in state.

11. The magnetic memory device according to claim 1, wherein film thicknesses of non-magnetic layers which configure the magneto resistive elements are different from each other.

12. The magnetic memory device according to claim 1, wherein materials of the magneto resistive elements are different from each other.

13. The magnetic memory device according to claim 1, wherein MR ratios of the magneto resistive elements are different from each other.

14. The magnetic memory device according to claim 1, wherein sizes of the magneto resistive elements are different from each other.

15. The magnetic memory device according to claim 1, wherein the magneto resistive elements are MTJ elements each configured by at least three layers including a first magnetic layer, second magnetic layer and non-magnetic layer or GMR elements each configured by at least three layers including a first magnetic layer, second magnetic layer and conductive layer.

16. The magnetic memory device according to claim 15, wherein the MTJ element has a single junction structure having the non-magnetic layer of one layer or a double junction structure having the non-magnetic layer of two layers.

17. The magnetic memory device according to claim 1, further comprising non-magnetic layers formed between the magneto resistive elements and having areas larger than those of the magneto resistive elements.

18. The magnetic memory device according to claim 1, wherein currents caused to flow into the bit line and the second word line are different for each of the selected magneto resistive elements among the magneto resistive elements when data is written only into the selected magneto resistive element.

19. The magnetic memory device according to claim 1, wherein multi-value data is read out based on the fact that resistances of the magneto resistive elements are different from each other when data is written into the magneto resistive elements.

* * * * *